United States Patent
Kim

(10) Patent No.: US 9,721,670 B1
(45) Date of Patent: Aug. 1, 2017

(54) SEMICONDUCTOR DEVICE AND OPERATING METHOD THEREOF

(71) Applicant: SK hynix Inc., Gyeonggi-do (KR)

(72) Inventor: Jung Hyeong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/345,875

(22) Filed: Nov. 8, 2016

(30) Foreign Application Priority Data

Jun. 15, 2016 (KR) .................. 10-2016-0074621

(51) Int. Cl.
| | | |
|---|---|---|
| *G11C 16/04* | (2006.01) | |
| *G11C 11/34* | (2006.01) | |
| *G11C 16/26* | (2006.01) | |
| *G11C 16/10* | (2006.01) | |
| *G11C 11/413* | (2006.01) | |
| *G11C 11/419* | (2006.01) | |
| *G11C 11/412* | (2006.01) | |

(52) U.S. Cl.
CPC ............ *G11C 16/26* (2013.01); *G11C 11/412* (2013.01); *G11C 11/413* (2013.01); *G11C 11/419* (2013.01); *G11C 16/0483* (2013.01); *G11C 16/10* (2013.01)

(58) Field of Classification Search
CPC ... G11C 11/419; G11C 11/412; G11C 11/413; G11C 16/26; G11C 16/0483; G11C 16/10
See application file for complete search history.

(56) References Cited

U.S. PATENT DOCUMENTS

| | | | | |
|---|---|---|---|---|
| 9,583,201 | B1* | 2/2017 | Lee ..................... | G11C 16/16 |
| 2016/0217863 | A1* | 7/2016 | An ..................... | G11C 16/14 |
| 2016/0260493 | A1* | 9/2016 | Kim ..................... | G11C 16/28 |
| 2016/0293235 | A1* | 10/2016 | Kim ..................... | G11C 7/22 |
| 2016/0293271 | A1* | 10/2016 | Won ................. | G11C 29/12005 |
| 2016/0336071 | A1* | 11/2016 | Park ..................... | G11C 16/12 |
| 2017/0092365 | A1* | 3/2017 | Lee ..................... | G11C 16/10 |

FOREIGN PATENT DOCUMENTS

| | | |
|---|---|---|
| KR | 1020120100247 | 9/2012 |
| KR | 1020130070922 | 6/2013 |

\* cited by examiner

*Primary Examiner* — Toan Le
(74) *Attorney, Agent, or Firm* — IP & T Group LLP

(57) ABSTRACT

A semiconductor device includes a plurality of first memory strings each first memory string having a channel with a first length and a plurality of second memory strings each second memory string having a channel with a second length shorter than the first length. A method of operating the semiconductor device includes: performing a first read operation on the first read unit, wherein the first read unit includes the first memory cells sharing the same first word line among first memory cells included in the plurality of the first memory strings; and performing a second read operation on the second read unit, wherein the second read unit includes the second memory cells sharing the same second word line among second memory cells included in the plurality of the second memory strings.

20 Claims, 10 Drawing Sheets

SEMICONDUCTOR DEVICE AND OPERATING METHOD THEREOF

CROSS-REFERENCE TO RELATED APPLICATION

The present application claims priority under 35 U.S.C. §119(a) to Korean patent application number 10-2016-0074621 filed on Jun. 15, 2016, which is incorporated herein in its entirety by reference.

BACKGROUND

Field of Invention

An aspect of the present disclosure relates to an electronic device and an operating method thereof, and more particularly, to a semiconductor device having a three-dimensional structure and a reading method thereof.

Description of the Related Art

Nonvolatile memory devices are memory devices which retain stored data even when a power supply is cut off. Improvements in the degree of integration of two-dimensional (2D) nonvolatile memory devices in which memory cells are formed in a single layer on a substrate have reached a limit. A three-dimensional (3D) structure for nonvolatile memory devices in which memory cells are vertically stacked on a substrate has been proposed recently.

A three-dimensional nonvolatile memory device includes interlayer insulating layers and gate electrodes alternately stacked, channel layers penetrating the interlayer insulating layers and the gate electrodes, and memory cells formed along the channel layers. Various 3D structures and manufacturing methods have been developed for improving the characteristics and operational reliability of 3D non-volatile memory devices.

SUMMARY

Various embodiments of the present invention are directed to a semiconductor device having an improved 3D structure and a method of operating the same. The semiconductor device can be more easily manufactured, has a stabler structure and improved characteristics. The present invention is also directed to an improved reading method for the semiconductor device.

According to an aspect of the present disclosure, there is provided a method of operating a semiconductor device including a plurality of first memory strings each first memory string having a channel with a first length and a plurality of second memory strings each second memory string having a channel with a second length shorter than the first length, the method including: performing a first read operation on a first read unit, wherein the first read unit includes first memory cells sharing the same first word line among first memory cells included in the plurality of the first memory strings; and performing a second read operation on a second read unit, wherein the second read unit includes second memory cells sharing the same second word line among second memory cells included in the plurality of the second memory strings.

According to an aspect of the present disclosure, there is provided a semiconductor device including: a first memory string having a channel with a first length; and a second memory string having a channel with a second length shorter than the first length, wherein a bit line electrically connected to the first memory string is precharged to a first level during a read operation of the first memory string, and a bit line electrically connected to the second memory string is precharged to a second level lower than the first level during in a read operation of the second memory string.

According to an aspect of the present disclosure, there is provided a semiconductor device including: a first memory string including a first pipe transistor having a channel with a first length; and a second memory string including a second pipe transistor having a channel with a second length shorter than the first length, wherein a bit line electrically connected to the first memory string is precharged to a first level during a read operation of the first memory string, and a bit line electrically connected to the second memory string is precharged to a second level lower than the first level during a read operation of the second memory string.

BRIEF DESCRIPTION OF THE DRAWINGS

These and other features and advantages of the present invention will become apparent to those skilled in the relevant art by the following detailed description in reference with the following drawings.

DETAILED DESCRIPTION

Figure 1A:
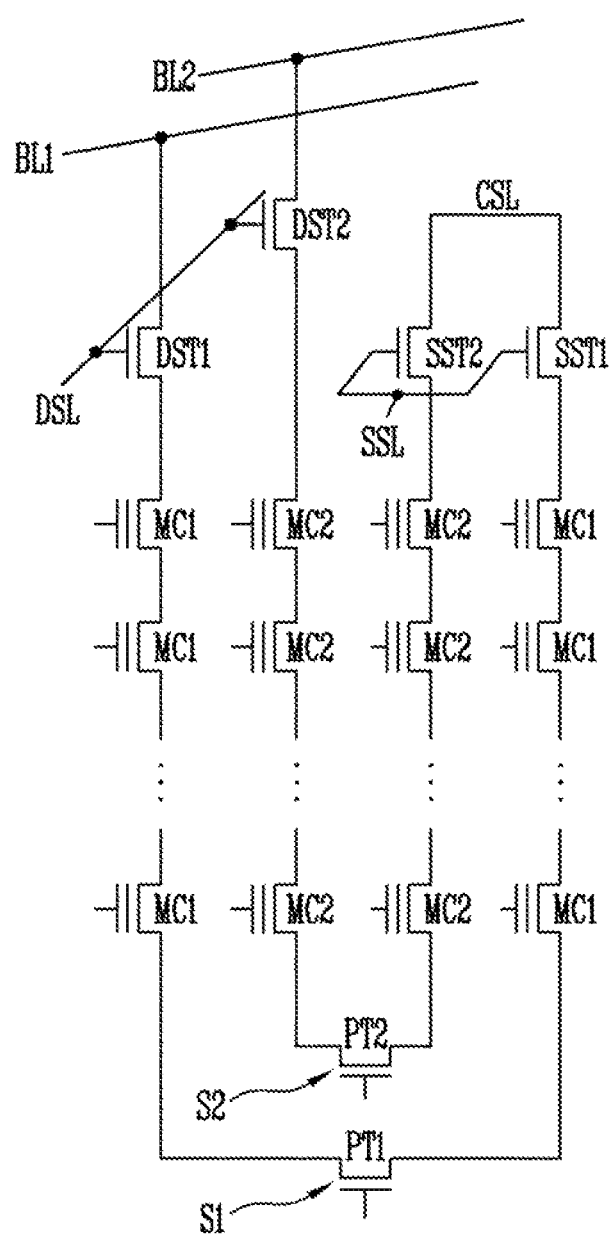
FIGS. 1A and 1B are circuit diagrams illustrating structures of memory strings of a semiconductor device according to an embodiment of the present disclosure.

Various embodiments of the present disclosure will be described with reference to the accompanying drawings. The present invention may, however, be embodied in many different forms and should not be construed as limited to the described embodiments set forth herein. Rather, the described embodiments are provided so that disclosure of the present disclosure will be thorough and complete, and will fully convey the scope of the present disclosure to those skilled in the art. The features of the described embodiments of the present disclosure may be employed in various and numerous embodiments without departing from the scope of the present disclosure. The drawings are not drawn to scale and the size and relative sizes of layers and areas may be exaggerated for clarity. Like reference numerals refer to like elements throughout.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above"

the other elements or features. The device may be otherwise oriented (rotated 90 degrees or at other orientations) and the spatially relative descriptors used herein interpreted accordingly.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, various embodiments of the present invention will be described in detail with reference to the attached drawings.

Figure 1B:
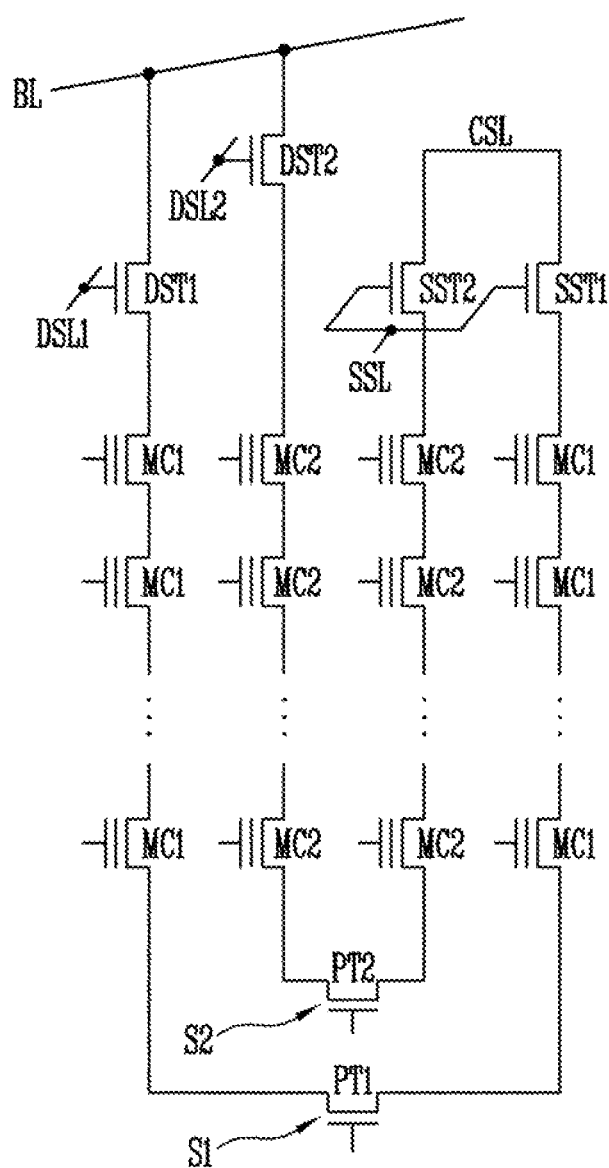

FIGS. 1A and 1B are circuit diagrams illustrating structures of memory strings of a semiconductor device according to an embodiment of the present disclosure.

Referring to FIGS. 1A and 1B, the semiconductor device includes first and second memory strings S1 and S2. The first and second memory strings have channels of different lengths. More specifically, the first memory string S1 has a channel with a first length and the second memory string S2 has a channel with a second length that is shorter than the first length.

The first memory string S1 may include at least one first drain select transistor DST1, a plurality of first memory cells MC1, a first pipe transistor PT1, a plurality of first memory cells MC1, and at least one first source select transistor SST1, which are connected in series. The second memory string S2 may include at least one second drain select transistor DST2, a plurality of second memory cells MC2, a second pipe transistor PT2, a plurality of second memory cells MC2, and at least one second source select transistor SST2, which are connected in series. The first and second memory strings S1 and S2 may be arranged in a U-shape. The first and second source select transistors SST1 and SST2 are operatively coupled to a common source line CSL. A source select line SSL is operatively coupled to the gates of the respective first and second source select transistors SST1 and SST2. A difference in channel length between the first memory string S1 and the second memory string S2 may be caused by several factors. For example, the difference in channel length between the first memory string S1 and the second memory string S2 may be caused by a difference in channel length between memory cells, a difference in channel length between select transistors, a difference in distance between adjacent memory cells, a difference in distance between adjacent select transistors, a difference in distance between a memory cell and a select transistor, which are adjacent to each other, a difference in channel length between pipe transistors, and the like. For example, the first memory cells MC1 may have the same or substantially the same channel length as the second memory cells MC2, whereas the second pipe transistor PT2 may have a shorter channel length than the first pipe transistor PT1. In addition, the distance between the second pipe transistor PT2 and the second memory cell MC2, which are connected in series, may be shorter than the distance between the first pipe transistor PT1 and the first memory cell MC1, which are also connected in series. Here, the term "substantially the same" means not only that numerical values correspond to each other but also that any difference between the numerical values of the channel lengths are within the range of errors in the manufacturing process and in measurement techniques.

Referring to FIG. 1A, memory strings having different lengths are electrically connected to different bit lines, respectively, and this connection may be controlled by the same drain select line. For example, the first memory string S1 is electrically connected to a first bit line BL1 under control of a drain select line DSL, and the second memory string S2 is electrically connected to a second bit line BL2 under control of the same drain select line DSL.

Also, the memory strings having different lengths are electrically connected to the same common source line CSL, and this connection may be controlled by the same source select line. For example, the first and second memory strings S1 and S2 are electrically connected to the common source line CSL under control of a source select line SSL.

Referring to FIG. 1B, memory strings having different lengths are electrically connected to the same bit line, and this connection may be controlled by a plurality of drain select lines. For example, the first memory string S1 is electrically connected to a bit line BL under control of a first drain select line DSL1 which is operatively coupled to the gate of the first drain select transistor DST1 of the first memory string S1. Also, the second memory string S2 is electrically connected to the bit line BL under control of the second drain select line DSL2 which is operatively coupled to the gate of the second select transistor DST2 of the second memory string S2

Also, the memory strings of FIG. 1B having different lengths are electrically connected to the same common source line CSL, and this connection may be controlled by the same source select line. For example, the first and second memory strings S1 and S2 are electrically connected to the common source line CSL under control of a source select line SSL.

According to an embodiment of the present invention, which employs the circuit structure of FIG. 1A or 1B, the precharge level of a bit line may be adjusted depending on the channel length of the memory strings which is operatively coupled to the bit line in a read operation. For example, the semiconductor device may include page buffers for controlling the bit lines during an operation such as a program operation or a read operation, and the page buffers may precharge the bit lines to different levels depending on channel lengths of the memory strings. As an example, if the first memory cell MC1 included in the first memory string S1 of FIG. 1A is selected, the first bit line BL1 is precharged to a first level. If the second memory cell MC2 included in the second memory string S2 of FIG. 1A is selected, the second bit line BL2 is precharged to a second level lower than the first level. As another example, if the first memory cell MC1 included in the first memory string S1 of FIG. 1B is selected, the bit line BL is precharged to a first level. If the second memory cell MC2 included in the second memory string S2 of FIG. 1B is selected, the bit line BL is precharged to a second level lower than the first level. In addition, the level difference between the first level and the second level may increase as the length difference between the first memory string S1 and the second memory string S2 increases.

Figure 2:
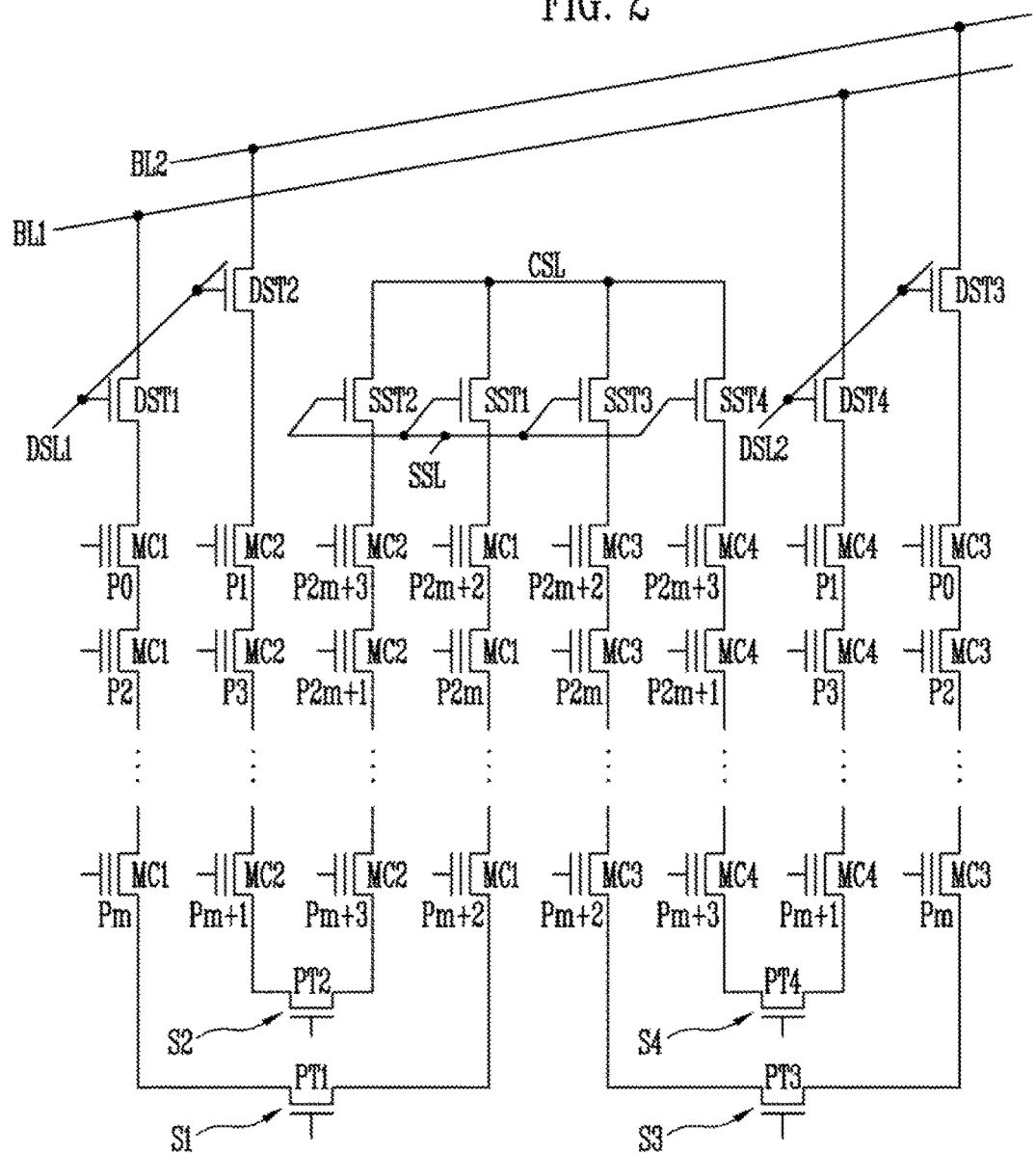
FIG. 2 is a circuit diagram illustrating a structure of a memory string of a semiconductor device according to an embodiment of the present disclosure.

FIG. 2 is a circuit diagram illustrating a structure of a memory string of a semiconductor device according to an embodiment of the present disclosure.

Referring to FIG. 2, the semiconductor device includes first to fourth memory strings S1 to S4 having channels of different lengths. Specifically, the first memory string S1 includes at least one first drain select transistor DST1, a plurality of first memory cells MC1, a first pipe transistor PT1, a plurality of first memory cells MC1, and at least one first source select transistor SST1, which are connected in series. The second memory string S2 includes at least one drain select transistor DST2, a plurality of second memory cells MC2, a second pipe transistor PT2, a plurality of second memory cells MC2, and at least one second source select transistor SST2, which are connected in series. The third memory string S3 includes at least one drain select transistor DST3, a plurality of third memory cells MC3, a third pipe transistor PT3, a plurality of third memory cells MC3, and at least one third source select transistor SST3, which are connected in series. The fourth memory string S4 includes at least one fourth drain select transistor DST4, a plurality of fourth memory cells MC4, a fourth pipe transistor PT4, a plurality of fourth memory cells MC4, and at least one fourth source select transistor SST4, which are connected in series.

Here, the second memory string S2 may have a shorter channel length than the first memory string S1, and the fourth memory string S4 may have a shorter channel length than the third memory string S3. The first memory string S1 and the third memory string S3 may have the same or substantially the same channel length, and the second memory string S2 and the fourth memory string S4 may have the same or substantially the same channel length. Each of the first to fourth memory strings S1 to S4 may be arranged in a U-shape.

The first memory string S1 is electrically connected to a first bit line BL1 under control of a first drain select line DSL1 which is operatively coupled to the gate of the first drain select transistor DST1. The second memory string S2 is electrically connected to a second bit line BL2 under control of the first drain select line DSL1 which is operatively coupled to the gate of the second drain select transistor DST2. The third memory string S3 is electrically connected to the second bit line BL2 under control of a second drain select line DSL2 which is operatively coupled to the gate of the third drain select transistor DST3. The fourth memory string S4 is electrically connected to the first bit line BL1 under control of the second drain select line DSL2 which is operatively coupled to the gate of the fourth drain select transistor DST4. The first to fourth memory strings S1 to S4 may be electrically connected to a common source line CSL under control of a source select line SSL which is operatively coupled to the respective gates of the first, second, third and fourth source select transistors SST1, SST2, SST3 and SST4.

In an embodiment of the present invention which employs the circuit structure of FIG. 2, a read operation is provided wherein addresses are assigned so that memory cells of memory strings having a relatively long channel length constitute one read unit and memory cells of memory strings having a relatively short channel length constitute one read unit. For example, first and third memory cells MC1 and MC3 sharing one word line among the first memory cells MC1 included in the first memory string S1 and the third memory cells MC3 included in the third memory string S3 may constitute one first read unit P0 to Pm and Pm+2 to P2m+2, respectively. Also, second and fourth memory cells MC2 and MC4 sharing one word line among the second memory cells MC2 included in the second memory string S2 and the fourth memory cells MC4 included in the fourth memory string S4 may constitute one second read unit P1 to Pm+1 and Pm+3 to P2m+3, respectively, where m is an even number of 2 or more. The read unit may be a page.

Precharge levels of bit lines may be adjusted depending on channel lengths of memory strings during a read operation. More specifically, precharge level is set to become lower as the channel length becomes shorter. For example, the first and second bit lines BL1 and BL2 are precharged to a first level during a read operation of the first read unit P0 to Pm and Pm+2 to P2m+2. The first and second bit lines BL1 and BL2 are precharged to a second level lower than the first level during a read operation of the second read unit P1 to Pm+1 and Pm+3 to P2m+3.

Figure 3:
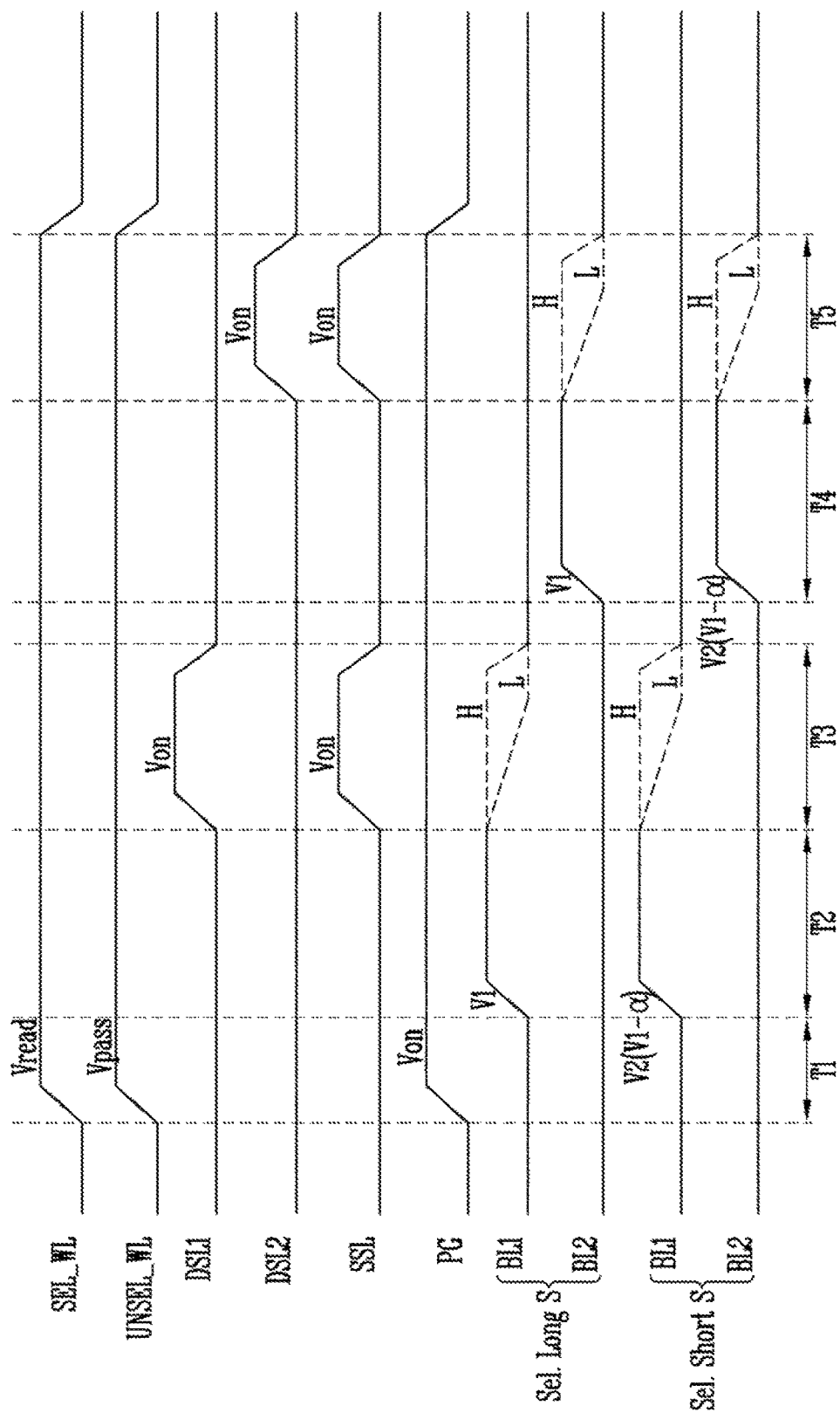
FIG. 3 is a timing diagram illustrating an operating method of a semiconductor device according to an embodiment of the present disclosure.

FIG. 3 is a timing diagram illustrating an operating method of a semiconductor device according to an embodiment of the present disclosure. Hereinafter, a read operation of the semiconductor device will be described with reference to FIGS. 2 and 3.

First, in a first section T1, a read voltage Vread is applied to a selected word line SEL_WL connected to a selected read unit, and a pass voltage Vpass is applied to an unselected word line UNSEL_WL. Here, the read voltage Vread has a level at which a memory cell is turned on or turned off depending on data written therein. For example, the read voltage Vread has a level at which a programmed memory cell is turned off and an erased memory cell is turned on. Also, the pass voltage Vpass has a level at which a memory cell is turned on regardless of data written therein. In addition, a turn-on voltage Von is applied to a pipe gate PG, thereby turning on the first to fourth pipe transistors PT1 to PT4.

In a second section T2, a selected first bit line BL1 connected to the selected read unit is precharged. For example, if the selected read unit is included in the memory strings S1 and S3 having a relatively long channel length, the first bit line BL1 is precharged to a first level V1. Otherwise, if the selected read unit is included in the memory strings S2 and S4 having a relatively short channel length, the first bit line BL1 is precharged to a second level V2 which is lower than the first level V1 by "α", hence V2 may be equal to "V1−α". At this time, the first and second drain select lines DSL1 and DSL2 are grounded, so that the first to fourth drain select transistors DST1 to DST4 maintain a turn-off state. The value "α" may be determined depending upon the difference in channel length between the first and second read units. For example, "α" may be greater than 0 and less than V1. In a third section T3, the turn-on voltage Von is applied to the first drain select line DSL1, thereby turning on the first drain select transistor DST1. Also, the common source line CSL is grounded, and the turn-on voltage Von is applied to the source select line SSL, thereby turning on the first source select transistor SST1. At this time, the second drain select line DSL2 is grounded, to maintain the turn-off state of the third and fourth drain select transistors DST3 and DST4.

In this case, the level of the first bit line BL1 is changed depending on data written in a selected memory cell. For example, when the selected memory cell is programmed, the potential of the first bit line BL1 maintains a precharge level, i.e., a 'high' level. Also, when the selected memory cell is erased, the potential of the first bit line BL1 is changed to a 'low' level.

In a fourth section T4, a selected second bit line BL2 connected to the selected read unit is precharged. For example, if the selected read unit is included in the memory strings S1 and S3 having a relatively long channel length, the second bit line BL2 is precharged to the first level V1. Otherwise, if the selected read unit is included in the memory strings S2 and S4 having a relatively short channel length, the second bit line BL2 is precharged to the second level V2=(V1−α) lower than the first level V1. At this time, the first and second drain select lines DSL1 and DSL2 are grounded, so that the first to fourth drain select transistors DST1 to DST4 maintain the turn-off state.

In a fifth section T, the turn-on voltage Von is applied to the second drain select line DSL2, thereby turning on the third drain select transistor DST3. Also, the common source line CSL is grounded, and the turn-on voltage Von is applied to the source select line SSL, thereby turning on the third source select transistor SST3. At this time, the first drain select line DSL1 is grounded, to maintain the turn-off state of the first and second drain select transistors DST1 and DST2.

In this case, the level of the second bit line BL2 is changed depending on data written in a selected memory cell. For example, when the selected memory cell is programmed, the potential of the second bit line BL2 maintains a precharge level, i.e., a 'high' level. Also, when the selected memory cell is erased, the potential of the second bit line BL2 is changed to a 'low' level.

According to the operating method described above, precharge levels of bit lines are adjusted depending on channel lengths, so that the read operation can be performed under different conditions depending on differences in channel lengths. Thus, although a memory string having a relatively long channel length has a lower cell current level than a memory string having a relatively short channel length, the precharge levels of the bit lines are adjusted, thereby compensating for such a difference. Also, although there exists a difference in threshold voltage between a pipe transistor having a relatively long channel length and a pipe transistor having a relatively short channel length, the precharge levels of the bit lines are adjusted, thereby compensating for such a difference.

Figure 4A:
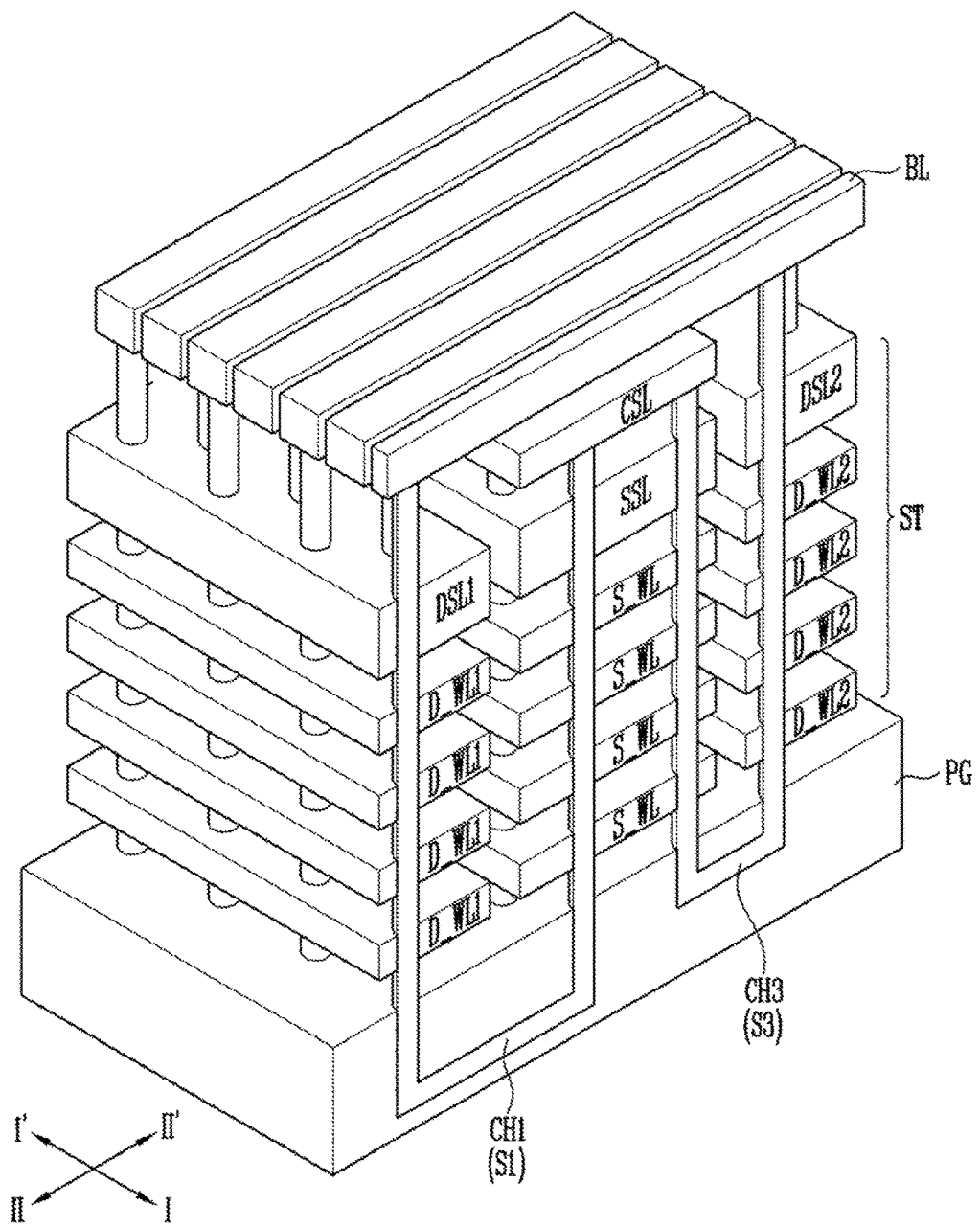
FIGS. 4A to 4D are diagrams illustrating a structure of a semiconductor device according to an embodiment of the present disclosure.
Figure 4B:
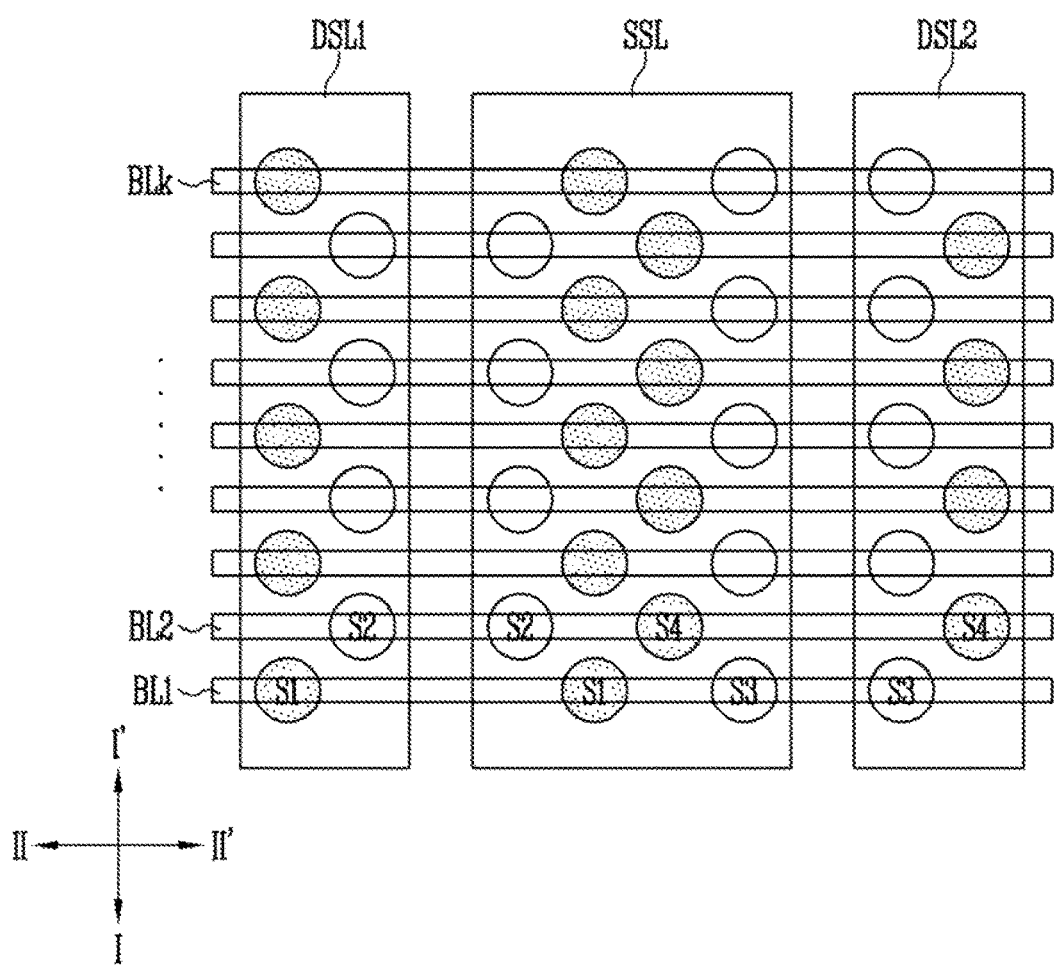
Figure 4C:
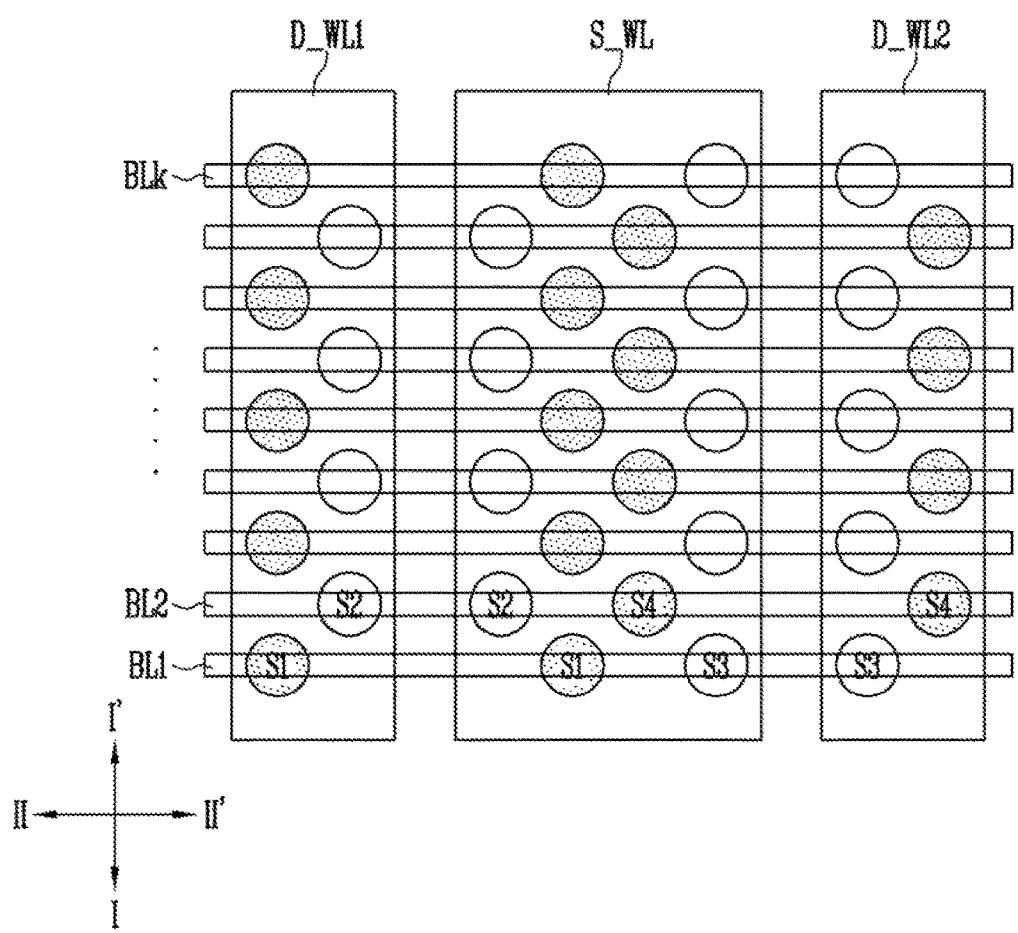
Figure 4D:
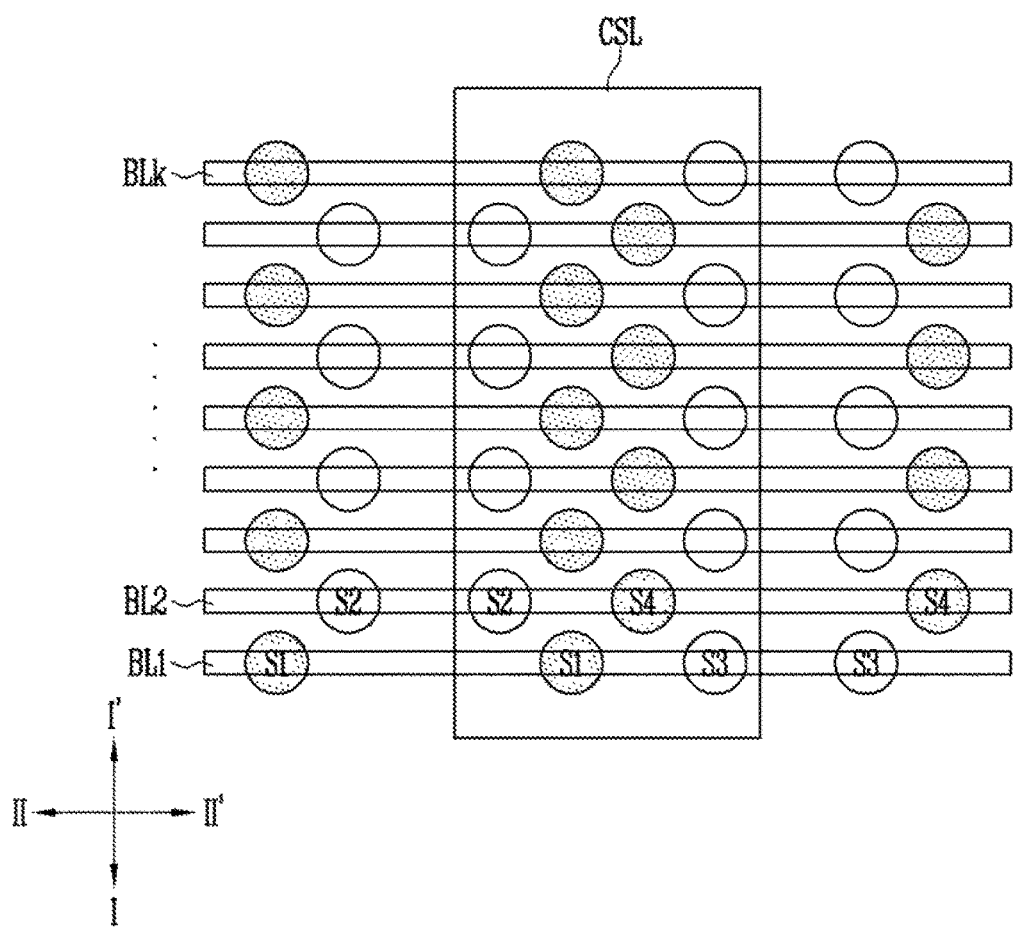

FIGS. 4A to 4D are diagrams illustrating a structure of a semiconductor device according to an embodiment of the present disclosure. FIG. 4A is a perspective view, FIG. 4B is a layout of select lines, FIG. 4C is a layout of word lines, and FIG. 4D is a layout of a common source line.

Referring to FIG. 4A, the semiconductor memory device includes a pipe gate PG, a stack structure ST formed over the pipe gate PG, a common source line CSL over the stack structure ST, bit lines BL over the common source line CSL, and channel layers CH1 and CH3 penetrating the stack structure ST.

The pipe gate PG may be a gate of a pipe transistor, and may include a conductive material such as polysilicon or tungsten. The stack structure ST includes conductive layers and insulating layers, which are alternately stacked. Here, at least one uppermost conductive layer may be a first or second drain select line DSL1 or DSL2 or a source select line SSL. Also, the other conductive layers may be first or second drain-side word lines D_WL1 or D_WL2 or source side word lines S_WL. For not unnecessarily obfuscating the illustration, the insulating layers which are interposed between the stacked conductive layers are omitted in this figure.

The channel layers CH1 and CH3 are arranged in a first direction I-I' and a second direction II-II' intersecting the first direction I-I'. Although not shown in this figure, memory layers may be interposed between the channel layers CH1 and CH3 and the conductive layers. Each of the memory layers may include a tunnel insulating layer, a data storage layer, and a charge blocking layer. The data storage layer may include a floating gate such as silicon, a charge trap material such as nitride, a phase changeable material, nano dots, and the like.

Each of the channel layers CH1 and CH3 has a U shape and includes first and second vertical or substantially vertical cell channel layers penetrating through the stack structure and a horizontal or substantially horizontal channel layer formed inside the pipe gate PG, and the horizontal channel layer links the vertical channel layers. Each channel may have a circular cross-section as shown in the embodiment of FIG. 4A, however, the invention is not so limited. More specifically, the first channel layer CH1 may include a pipe channel layer in the pipe gate PG, a drain-side cell channel layer penetrating the first drain-side word lines D_WL1 and the first drain select line DSL1, and a source-side channel layer penetrating the source-side word lines S_WL and the source select line SSL. Thus, a pipe transistor is located in a region in which the first channel layer CH1 intersects the pipe gate PG, first memory cells MC1 are located in regions in which the first channel layer CH1 intersects the first drain-side word lines D_WL1 and the source-side word lines S_WL, a first source select transistor SST1 is located in a region in which the first channel layer CH1 intersects the source select line SSL, and a first drain select transistor DST1 is located in a region in which the first channel layer CH1 intersects the first drain select line DSL1. Accordingly, a first memory string S1 arranged in a U-shape is configured.

Similarly, the third channel layer CH3 may include a pipe channel layer, a drain-side cell channel layer, and a source-side cell channel layer. Accordingly, a third memory string S3 is configured, which includes at least one drain select transistor, a plurality of third memory cells, a third pipe transistor, a plurality of third memory cells, and at least one source select transistor, and is arranged in a U-shape.

Referring to FIGS. 4A and 4B, the first memory string S1 and a second memory string S2 are arranged adjacent to each other in the first direction I-I', and the third memory string S3 and a fourth memory string S4 are arranged adjacent to each other in the first direction I-I'. Also, the first memory string S1 and the third memory string S3 are arranged adjacent to each other in the second direction II-II', and the second memory string S2 and the fourth memory string S4 are arranged adjacent to each other in the second direction II-II'.

The first memory string S1 and the second memory string S2 may be located to vertically overlap with each other, and the third memory string S3 and the fourth memory string S4 may be located to vertically overlap with each other. For example, a second pipe transistor PT2 may be located over a first pipe transistor PT1, and first memory cells MC1 and second memory cells MC2, which correspond to each other, may be located at the same or substantially the same level. Also, a fourth pipe transistor PT4 may be located over a third pipe transistor PT3, and third memory cells MC3 and fourth memory cells MC4, which correspond to each other, may be located at the same or substantially the same level.

Here, the first pipe transistor PT1 and the third pipe transistor PT3 may be located at the same or substantially the same level, and the second pipe transistor PT2 and the fourth pipe transistor PT4 may be located at the same or substantially the same level. In addition, the second pipe transistor PT2 may have a shorter channel length than the first pipe transistor PT1, and the fourth pipe transistor PT4 may have a shorter channel length than the third pipe transistor PT3.

Referring to FIGS. 4A, and 4B, the first memory string S11 and the third memory string S3 are electrically connected to a first bit line BL1, and the second memory string S2 and the fourth memory string S4 are electrically connected to a second bit line BL2.

The first memory string S1 and the second memory string S2 share the first drain select line DSL1, and the third memory string S3 and the fourth memory string S4 share the second drain select line DSL2. The first to fourth memory strings S1 to S4 share the source select line SSL.

Referring to FIG. 4C, the first memory string S1 and the second memory string S2 share the first drain-side word line D_WL1, and the third memory string S3 and the fourth memory string S4 share the second drain-side word line D_WL2. The first to fourth memory strings S1 to S4 share the source-side word line S_WL.

Referring to FIG. 4D, the first to fourth memory strings S1 to S4 share the common source line CSL.

According to the above-described structure, during a read operation of the first and fourth memory strings S1 and S4 having a relatively long channel length, the first and second bit lines BL1 and BL2 may be precharged to a first level. During a read operation of the second and third memory strings S2 and S3 having a relatively short channel length, the first and second bit lines BL1 and BL2 may be precharged to a second level lower than the first level.

For reference, the semiconductor device having a structure in which U-shaped channel layers are arranged in a matrix form has been described in this embodiment, but the present disclosure is not limited thereto. The present disclosure may be applied to a semiconductor device including memory strings having different channel lengths, and the stack structure, the shape of the channel layer, the data storage method, the material of the memory layer, and the like may be variously changed.

Figure 5:
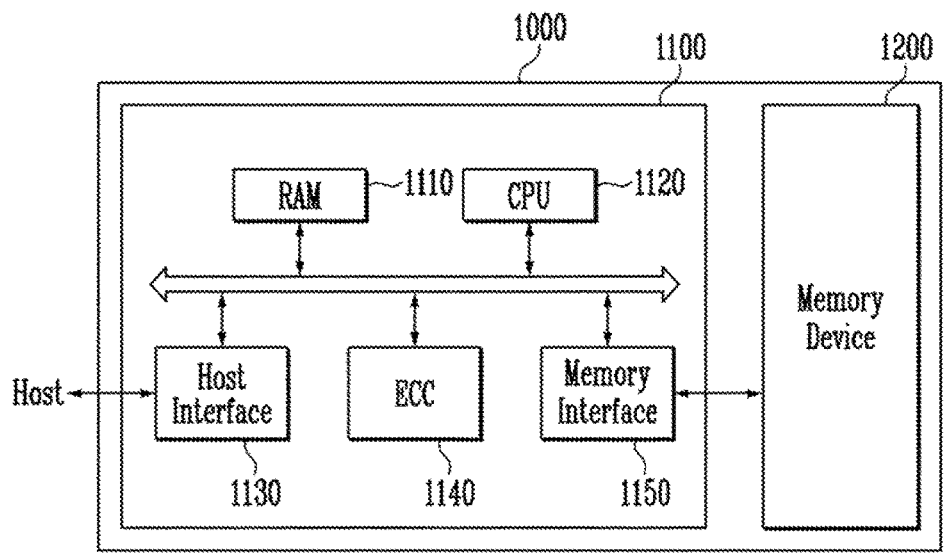
FIGS. 5 and 6 are block diagrams illustrating configurations of memory systems according to embodiments of the present disclosure.

FIG. 5 is a block diagram illustrating a configuration of a memory system 1000 according to an embodiment of the present disclosure.

Referring to FIG. 5, the memory system 1000 includes a memory device 1200 and a controller 1100.

The memory device 1200 is used to store data related information which may have various data formats such as texts, graphics, and software codes. The memory device 1200 may be a nonvolatile memory, and may include the structures described with reference to FIGS. 1A to 4D. Also, the memory device 1200 includes: a first memory string having a channel with a first length; and a second memory string having a channel with a second length shorter than the first length. A bit line electrically connected to the first memory string is precharged to a first level during a read operation of the first memory string, while a bit line electrically connected to the second memory string is precharged to a second level lower than the first level during a read operation of the second memory string. The structure and operating method of the memory device 1200 are the same as described above, and therefore, their detailed descriptions will be omitted.

The controller 1100 is coupled to a host and the memory device 1200 and is configured to access the memory device 1200 in response to a request from the host. For example, the controller 1100 is configured to control read, write, erase, and background operations for the memory device 1200.

The controller 1100 includes a random access memory (RAM) 1110, a central processing unit (CPU) 1120, a host interface 1130, an error correction code (ECC) circuit 1140, and a memory interface 1150 operatively coupled via an internal bus.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), and the like.

The CPU 1120 is configured to control the general operations of the controller 1100. For example, the CPU 1120 is configured to operate a firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 may include a NAND interface or a NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a read only memory (ROM) that stores code data for interfacing with the host.

As described above, the memory system 1000 includes the memory device 1200 having an improved degree of integration and improved characteristics, and thus it is possible to improve the degree of integration and characteristics of the memory system 1000.

Figure 6:
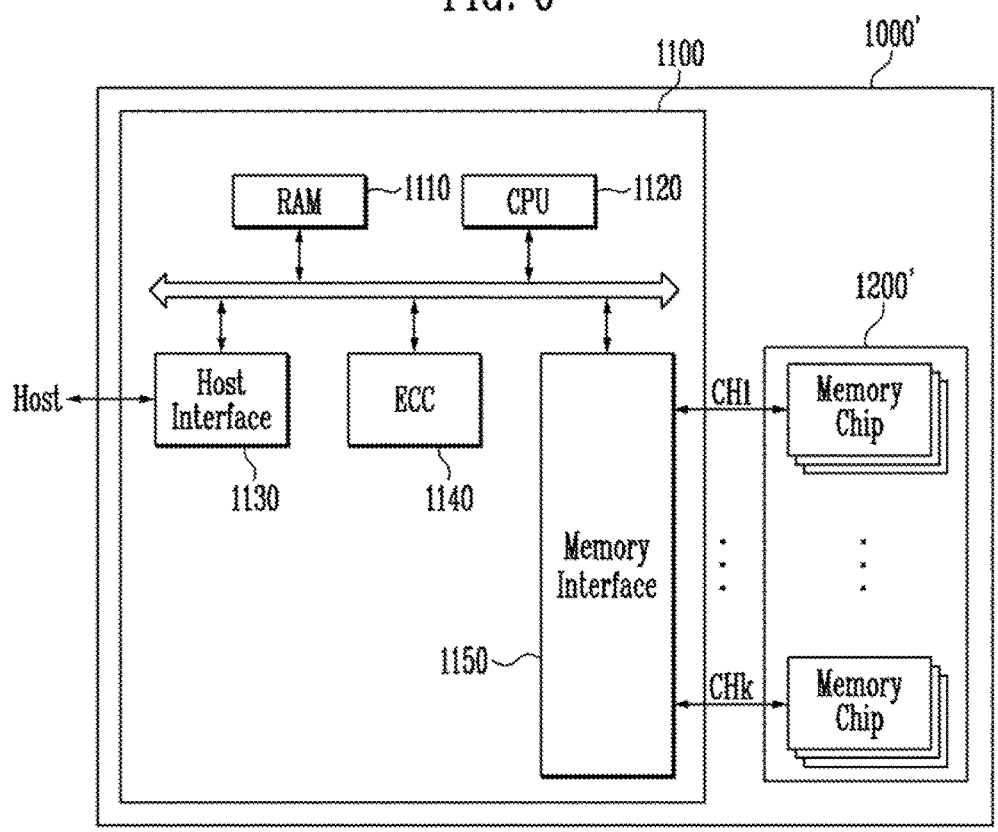

FIG. 6 is a block diagram illustrating a configuration of a memory system 1000' according to an embodiment of the present disclosure. Hereinafter, description of contents overlapping with those described above will be omitted.

Referring to FIG. 6, the memory system 1000' includes a memory device 1200' and a controller 1100. The controller 1100 includes a random access memory (RAM) 1110, a central processing unit (CPU) 1120, a host interface 1130, an error correction code (ECC) circuit 1140, a memory interface 1150, and the like.

The memory device 1200' may be a nonvolatile memory, and may include the memory strings described with reference to FIGS. 1A to 4D. Also, the memory device 1200' includes: a first memory string having a channel with a first length; and a second memory string having a channel with a second length shorter than the first length. A bit line electrically connected to the first memory string is precharged to a first level during a read operation of the first memory string, while a bit line electrically connected to the second memory string is precharged to a second level lower than the first level during a read operation of the second memory string. The structure and operating method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' includes the memory device 1200' having an improved degree of integration and improved characteristics, and thus it is possible to improve the degree of integration and characteristics of the memory system 1000'. The memory device 1200' may be configured as a multi-chip package for increasing the data storage capacity of the memory system 1000' and for improving the operation speed of the memory system 1000'.

Figure 7:
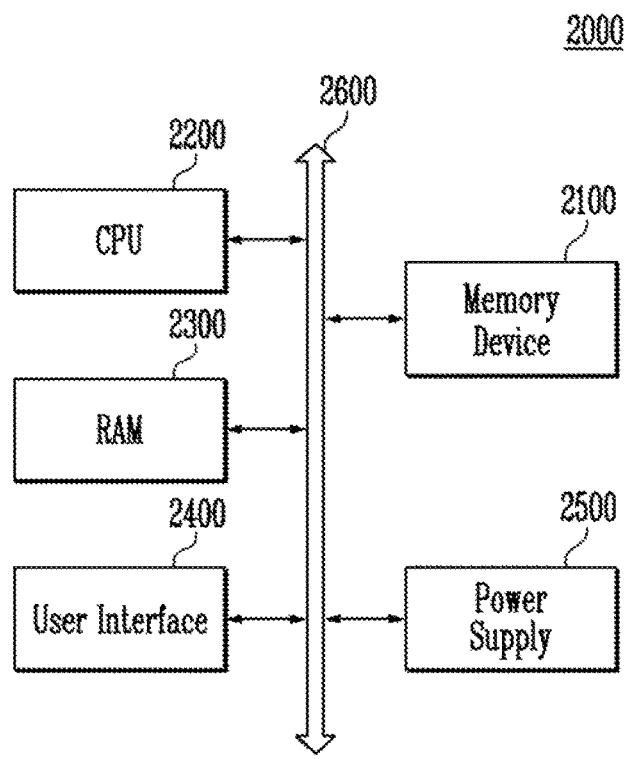
FIGS. 7 and 8 are block diagrams illustrating configurations of computing systems according to embodiments of the present disclosure.

FIG. 7 is a block diagram illustrating a configuration of a computing system 2000 according to an embodiment of the present disclosure. Hereinafter, description of contents overlapping with those described above will be omitted.

Referring to FIG. 7, the computing system 2000 includes a memory device 2100, a central processing unit (CPU) 2200, a random access memory (RAM) 2300, a user interface 2400, a power source 2500, and a system bus 2600.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller 1100 of FIGS. 5 and 6 may be performed by the CPU 2200, the RAM 2300, etc.

Here, the memory device 2100 may be a nonvolatile memory, and may include the memory strings described with reference to FIGS. 1A to 4D. Also, the memory device 2100 includes: a first memory string having a channel with a first length; and a second memory string having a channel with a second length shorter than the first length. A bit line electrically connected to the first memory string is precharged to a first level during a read operation of the first memory string, while a bit line electrically connected to the second memory string is precharged to a second level lower than the first level during a read operation of the second memory string. The structure and operating method of the memory device 2100 are the same as described above, and therefore, their detailed descriptions will be omitted.

The memory device 2100 may be a multi-chip package including a plurality of memory chips as described with reference to FIG. 6.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 includes the memory device 2100 having an improved degree of integration and improved characteristics, and thus it is possible to improve the degree of integration and characteristics of the computing system 2000.

Figure 8:
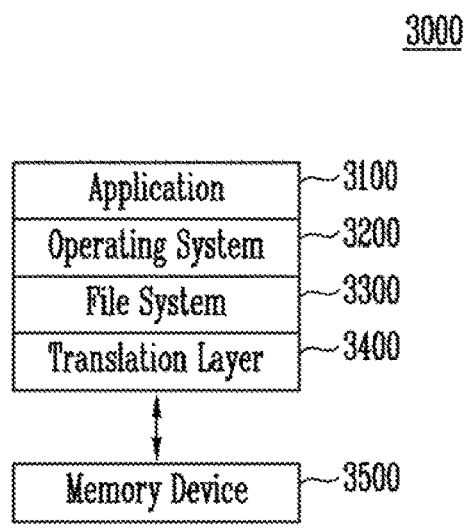

FIG. 8 is a block diagram illustrating a computing system 3000 according to an embodiment of the present disclosure.

Referring to FIG. 8, the computing system 3000 includes a software layer including an application 3100, an operating system 3200, a file system 3300, a translation layer 3400, and the like. In addition, the computing system 3000 includes a hardware layer of a memory device 3500, and the like.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 may be a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the application 3100, the operating system 3200, and the file system 3300 are shown as individual blocks. However, the invention is not limited in this way. For example, in an embodiment, the application 3100 and the file system 3300 may be included in the operating system 3200.

In operation, the translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory, and may include the memory strings described with reference to FIGS. 1A to 4D. Also, the memory device 3500 includes: a first memory string having a channel with a first length; and a second memory string having a channel with a second length shorter than the first length. A bit line electrically connected to the first memory string is precharged to a first level during a read operation of the first memory string, while a bit line electrically connected to the second memory string is precharged to a second level lower than the first level during a read operation of the second memory string. The structure and operating method of the memory device 3500 are the same as described above, and therefore, their detailed descriptions will be omitted.

The computing system 3000 configured as described above may be divided into an operating system layer performed in an upper level region and a controller layer performed in a lower level region. For example, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having an improved degree of integration and improved characteristics, and thus it is possible to improve the degree of integration and characteristics of the computing system 3000.

According to the present disclosure, the semiconductor device includes memory strings having different channel lengths, and assigns addresses such that memory strings having a relatively long channel length constitute one read unit and memory strings having relatively short channel length constitute one read unit. Also, in a read operation, precharge levels of bit lines are differently adjusted depending on channel lengths of the memory strings. Thus, conditions of the read operation are set depending on channel lengths, thereby securing a read margin.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor device including a plurality of first memory strings each first memory string having a channel with a first length and a plurality of second memory strings each second memory string having a channel with a second length shorter than the first length, the method comprising:
performing a first read operation on a first read unit, wherein the first read unit includes first memory cells sharing the same first word line among first memory cells included in the plurality of the first memory strings; and
performing a second read operation on a second read unit, wherein the second read unit includes second memory cells sharing the same second word line among second memory cells included in the plurality of the second memory strings.

2. The method of claim 1, wherein each of the first read unit and the second read unit is one page.

3. The method of claim 1, wherein a bit line connected to the first memory string is precharged to a first level during the first read operation, and a bit line connected to the second memory string is precharged to a second level different from the first level during the second read operation.

4. The method of claim 3, wherein the level difference between the first level and the second level increases as the length difference between the first length and the second length increases.

5. The method of claim 1, wherein a bit line connected to the first memory string is precharged to a first level during the first read operation, and a bit line connected to the second memory string is precharged to a second level lower than the first level during the second read operation.

6. The method of claim 5, wherein the first memory string and the second memory string are connected to different bit lines from each other.

7. The method of claim 5, wherein the first memory string and the second memory string are connected to the same bit line.

8. A semiconductor device comprising:
a first memory string having a channel with a first length; and
a second memory string having a channel with a second length shorter than the first length,
wherein a bit line electrically connected to the first memory string is precharged to a first level during a read operation of the first memory string, and a bit line electrically connected to the second memory string is precharged to a second level lower than the first level during a read operation of the second memory string.

9. The semiconductor device of claim 8, wherein the bit line is precharged by a page buffer during a read operation.

10. The semiconductor device of claim 8, further comprising:
a first bit line electrically connected to the first memory string;
a second bit line electrically connected to the second memory string; and
a drain select line controlling the connection between the first memory string and the first bit line and the connection between the second memory string and the second bit line.

11. The semiconductor device of claim 10, further comprising:
a third memory string electrically connected to the second bit line, the third memory string having a channel with a length longer than the second length; and
a fourth memory string electrically connected to the first bit line, the fourth memory string having a channel with a length shorter than the first length,
wherein a first memory cell and a third memory cell, which share one word line, among first memory cells included in the first memory string and third memory cells included in the third memory string constitute one read unit, and a second memory cell and a fourth memory cell, which share one word line, among second memory cells included in the second memory string and fourth memory cells included in the fourth memory string constitute one read unit.

12. The semiconductor device of claim 11, further comprising a common source line electrically connected to the first to fourth memory strings.

13. The semiconductor device of claim 11, wherein the one read unit is one page.

14. The semiconductor device of claim 8, further comprising:
a first bit line electrically connected to the first and second memory strings;
a first drain select line controlling the connection between the first memory string and the first bit line; and
a second drain select line controlling the connection between the second memory string and the first bit line.

15. The semiconductor device of claim 14, further comprising:
a third memory string electrically connected to the second bit line, the third memory string having a channel with a length longer than the second length;
a fourth memory string electrically connected to the first bit line, the fourth memory string having a channel with a length shorter than the first length; and a second bit line electrically connected to the third and fourth memory strings, wherein a first memory cell and a third memory cell, which share one word line, among first memory cells included in the first memory string and third memory cells included in the third memory string constitute one read unit, and a second memory cell and a fourth memory cell, which share one word line, among second memory cells included in the second memory string and fourth memory cells included in the fourth memory string constitute one read unit.

16. The semiconductor device of claim 15, further comprising a common source line electrically connected to the first to fourth memory strings.

17. The semiconductor device of claim 15, wherein each of the first read unit and the second read unit is one page.

18. A semiconductor device comprising:
a first memory string including a first pipe transistor having a channel with a first length; and
a second memory string including a second pipe transistor having a channel with a second length shorter than the first length, wherein a bit line electrically connected to the first memory string is precharged to a first level during a read operation of the first memory string, and a bit line electrically connected to the second memory string is precharged to a second level lower than the first level during a read operation of the second memory string.

19. The semiconductor device of claim 18, wherein the first memory string includes at least one first drain select transistor, a plurality of first memory cells the first pipe transistor, a plurality of first memory cells, and at least one first source select transistor, which are connected in series, and the second memory string includes at least one second drain select transistor, a plurality of second memory cells the second pipe transistor, a plurality of second memory cells, and at least one second source select transistor, which are connected in series.

20. The semiconductor device of claim 18, wherein the first pipe transistor and the second pipe transistor have threshold voltages of different levels.

* * * * *